United States Patent
Roper et al.

(10) Patent No.: US 7,522,421 B2
(45) Date of Patent: Apr. 21, 2009

(54) SPLIT CORE CIRCUIT MODULE

(75) Inventors: David L. Roper, Austin, TX (US);
Douglas Wehrly, Jr., Austin, TX (US);
Mark Wolfe, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 0 days.

(21) Appl. No.: 11/777,925

(22) Filed: Jul. 13, 2007

(65) Prior Publication Data

US 2007/0258217 A1   Nov. 8, 2007

Related U.S. Application Data

(63) Continuation-in-part of application No. 11/364,489, filed on Feb. 27, 2006, now Pat. No. 7,289,327, and a continuation-in-part of application No. 11/283,355, filed on Nov. 18, 2005, and a continuation-in-part of application No. 11/255,061, filed on Oct. 19, 2005, and a continuation-in-part of application No. 10/934,027, filed on Sep. 3, 2004.

(51) Int. Cl.
*H05K 7/20* (2006.01)

(52) U.S. Cl. .............. 361/707; 361/704; 361/721; 257/719; 257/724; 165/185

(58) Field of Classification Search .............. 361/697, 361/704, 709–710, 715, 719–721; 165/80.3, 165/104.33, 185; 174/16.3
See application file for complete search history.

(56) References Cited

U.S. PATENT DOCUMENTS

| | | | |
|---|---|---|---|
| 3,372,310 A | 3/1968 | Kantor | |
| 3,436,604 A | 4/1969 | Hyltin | |
| 3,582,865 A * | 6/1971 | Franck et al. | 439/67 |
| 3,654,394 A | 4/1972 | Gordon | |
| 3,704,455 A | 11/1972 | Scarbrough | |
| 3,718,842 A | 2/1973 | Abbott, III et al. | |
| 3,727,064 A | 4/1973 | Bottini | |
| 3,746,934 A | 7/1973 | Stein | |
| 3,766,439 A | 10/1973 | Isaacson | |
| 3,772,776 A | 11/1973 | Weisenburger | |

(Continued)

FOREIGN PATENT DOCUMENTS

EP   122-687 A   10/1984

(Continued)

OTHER PUBLICATIONS

U.S. Appl. No. 11/306,803, filed Jan. 11, 2006, Chris Karabatsos.

(Continued)

*Primary Examiner*—Jayprakash N Gandhi
*Assistant Examiner*—Courtney Smith
(74) *Attorney, Agent, or Firm*—Fish & Richardson P.C.

(57) ABSTRACT

Flexible circuitry is populated with integrated circuitry (ICs) disposed along one or both major sides. Contacts distributed along the flexible circuitry provide connection between the module and an application environment. A rigid substrate configured with wings diverging from a central axis to create, preferably, a 'V'-shaped structure provide supportive structure for the populated flex circuitry that is wrapped about an edge of the substrate.

25 Claims, 9 Drawing Sheets

U.S. PATENT DOCUMENTS

| | | |
|---|---|---|
| 4,169,642 A | 10/1979 | Mouissie |
| 4,288,841 A | 9/1981 | Gogal |
| 4,342,069 A | 7/1982 | Link |
| 4,429,349 A | 1/1984 | Zachry |
| 4,437,235 A | 3/1984 | McIver |
| 4,513,368 A | 4/1985 | Houseman |
| 4,547,834 A | 10/1985 | Dumont et al. |
| 4,567,543 A | 1/1986 | Miniet |
| 4,587,596 A | 5/1986 | Bunnell |
| 4,645,944 A | 2/1987 | Uya |
| 4,656,605 A | 4/1987 | Clayton |
| 4,672,421 A | 6/1987 | Lin |
| 4,682,207 A | 7/1987 | Akasaki et al. |
| 4,696,525 A | 9/1987 | Coller et al. |
| 4,709,300 A | 11/1987 | Landis |
| 4,724,611 A | 2/1988 | Hagihara |
| 4,727,513 A | 2/1988 | Clayton |
| 4,733,461 A | 3/1988 | Nakano |
| 4,739,589 A | 4/1988 | Brehm et al. |
| 4,763,188 A | 8/1988 | Johnson |
| 4,771,366 A | 9/1988 | Blake et al. |
| 4,821,007 A | 4/1989 | Fields et al. |
| 4,823,234 A | 4/1989 | Konishi et al. |
| 4,833,568 A | 5/1989 | Berhold |
| 4,850,892 A | 7/1989 | Clayton et al. |
| 4,862,249 A | 8/1989 | Carlson |
| 4,911,643 A | 3/1990 | Perry et al. |
| 4,953,060 A | 8/1990 | Lauffer et al. |
| 4,956,694 A | 9/1990 | Eide |
| 4,972,580 A | 11/1990 | Nakamura |
| 4,982,265 A | 1/1991 | Watanabe et al. |
| 4,983,533 A | 1/1991 | Go |
| 4,985,703 A | 1/1991 | Kaneyama |
| 4,992,849 A | 2/1991 | Corbett et al. |
| 4,992,850 A | 2/1991 | Corbett et al. |
| 5,014,115 A | 5/1991 | Moser |
| 5,014,161 A | 5/1991 | Lee et al. |
| 5,016,138 A | 5/1991 | Woodman |
| 5,025,306 A | 6/1991 | Johnson et al. |
| 5,034,350 A | 7/1991 | Marchisi |
| 5,041,015 A | 8/1991 | Travis |
| 5,053,853 A | 10/1991 | Haj-Ali-Ahmadi et al. |
| 5,065,277 A | 11/1991 | Davidson |
| 5,099,393 A | 3/1992 | Bentlage et al. |
| 5,104,820 A | 4/1992 | Go et al. |
| 5,109,318 A | 4/1992 | Funari et al. |
| 5,117,282 A | 5/1992 | Salatino |
| 5,119,269 A | 6/1992 | Nakayama |
| 5,138,430 A | 8/1992 | Gow, 3rd et al. |
| 5,138,434 A | 8/1992 | Wood et al. |
| 5,140,405 A | 8/1992 | King et al. |
| 5,159,535 A | 10/1992 | Desai et al. |
| 5,173,840 A | 12/1992 | Kodai et al. |
| 5,191,404 A | 3/1993 | Wu et al. |
| 5,208,729 A | 5/1993 | Cipolla et al. |
| 5,214,845 A | 6/1993 | King et al. |
| 5,219,377 A | 6/1993 | Poradish |
| 5,222,014 A | 6/1993 | Lin |
| 5,224,023 A | 6/1993 | Smith et al. |
| 5,229,916 A | 7/1993 | Frankeny et al. |
| 5,229,917 A | 7/1993 | Harris et al. |
| 5,239,198 A | 8/1993 | Lin et al. |
| 5,241,454 A | 8/1993 | Ameen et al. |
| 5,241,456 A | 8/1993 | Marcinkiewiez et al. |
| 5,247,423 A | 9/1993 | Lin et al. |
| 5,252,857 A | 10/1993 | Kane et al. |
| 5,259,770 A | 11/1993 | Bates et al. |
| 5,261,068 A | 11/1993 | Gaskins et al. |
| 5,268,815 A | 12/1993 | Cipolla et al. |
| 5,276,418 A | 1/1994 | Klosowiak et al. |
| 5,281,852 A | 1/1994 | Normington |
| 5,285,398 A | 2/1994 | Janik |
| 5,289,062 A | 2/1994 | Wyland |
| 5,309,986 A | 5/1994 | Itoh |
| 5,313,097 A | 5/1994 | Haj-Ali-Ahmadi et al. |
| 5,347,428 A | 9/1994 | Carson et al. |
| 5,362,656 A | 11/1994 | McMahon |
| 5,375,041 A | 12/1994 | McMahon |
| 5,386,341 A | 1/1995 | Olson et al. |
| 5,394,300 A | 2/1995 | Yoshimura |
| 5,397,916 A | 3/1995 | Normington |
| 5,400,003 A | 3/1995 | Kledzik |
| 5,428,190 A | 6/1995 | Stopperan |
| 5,438,224 A | 8/1995 | Papageorge et al. |
| 5,448,511 A | 9/1995 | Paurus et al. |
| 5,477,082 A | 12/1995 | Buckley, III et al. |
| 5,491,612 A | 2/1996 | Nicewarner, Jr. et al. |
| 5,502,333 A | 3/1996 | Bertin et al. |
| 5,523,619 A | 6/1996 | McAllister et al. |
| 5,523,695 A | 6/1996 | Lin |
| 5,541,812 A | 7/1996 | Burns |
| 5,572,065 A | 11/1996 | Burns |
| 5,600,178 A | 2/1997 | Russell |
| 5,612,570 A | 3/1997 | Eide et al. |
| 5,631,193 A | 5/1997 | Burns |
| 5,642,055 A | 6/1997 | Difrancesco |
| 5,644,161 A | 7/1997 | Burns |
| 5,646,446 A | 7/1997 | Nicewarner et al. |
| 5,654,877 A | 8/1997 | Burns |
| 5,661,339 A | 8/1997 | Clayton |
| 5,686,730 A | 11/1997 | Laudon et al. |
| 5,688,606 A | 11/1997 | Mahulikar et al. |
| 5,708,297 A | 1/1998 | Clayton |
| 5,714,802 A | 2/1998 | Cloud et al. |
| 5,717,556 A | 2/1998 | Yanagida |
| 5,729,894 A | 3/1998 | Rostoker et al. |
| 5,731,633 A | 3/1998 | Clayton |
| 5,744,862 A | 4/1998 | Ishii |
| 5,751,553 A | 5/1998 | Clayton |
| 5,754,409 A | 5/1998 | Smith |
| 5,764,497 A | 6/1998 | Mizumo |
| 5,776,797 A | 7/1998 | Nicewarner, Jr. et al. |
| 5,789,815 A | 8/1998 | Tessier et al. |
| 5,790,447 A | 8/1998 | Laudon et al. |
| 5,802,395 A | 9/1998 | Connolly et al. |
| 5,805,422 A | 9/1998 | Otake et al. |
| 5,828,125 A | 10/1998 | Burns |
| 5,835,988 A | 11/1998 | Ishii |
| 5,869,353 A | 2/1999 | Levy et al. |
| 5,899,705 A | 5/1999 | Akram |
| 5,917,709 A | 6/1999 | Johnson et al. |
| 5,925,934 A | 7/1999 | Lim |
| 5,926,369 A | 7/1999 | Ingraham et al. |
| 5,949,657 A | 9/1999 | Karabatsos |
| 5,953,214 A | 9/1999 | Dranchak et al. |
| 5,953,215 A | 9/1999 | Karabatsos |
| 5,959,839 A | 9/1999 | Gates |
| 5,963,427 A * | 10/1999 | Bollesen ................... 361/704 |
| 5,973,395 A | 10/1999 | Suzuki et al. |
| 5,995,370 A | 11/1999 | Nakamori |
| 6,002,167 A | 12/1999 | Hatano et al. |
| 6,002,589 A | 12/1999 | Perino et al. |
| 6,008,538 A | 12/1999 | Akram et al. |
| 6,014,316 A | 1/2000 | Eide |
| 6,021,048 A | 2/2000 | Smith |
| 6,025,992 A | 2/2000 | Dodge et al. |
| 6,028,352 A | 2/2000 | Eide |
| 6,028,365 A | 2/2000 | Akram et al. |
| 6,034,878 A | 3/2000 | Osaka et al. |
| 6,038,132 A | 3/2000 | Tokunaga et al. |
| 6,040,624 A | 3/2000 | Chambers et al. |
| 6,049,975 A | 4/2000 | Clayton |
| 6,060,339 A | 5/2000 | Akram et al. |
| 6,072,233 A | 6/2000 | Corisis et al. |

| | | |
|---|---|---|
| 6,078,515 A | 6/2000 | Nielsen et al. |
| 6,084,294 A | 7/2000 | Tomita |
| 6,091,145 A | 7/2000 | Clayton |
| 6,097,087 A | 8/2000 | Farnworth et al. |
| 6,111,757 A | 8/2000 | Dell et al. |
| 6,121,676 A | 9/2000 | Solberg |
| RE36,916 E | 10/2000 | Moshayedi |
| 6,157,541 A | 12/2000 | Hacke |
| 6,172,874 B1 | 1/2001 | Bartilson |
| 6,178,093 B1 | 1/2001 | Bhatt et al. |
| 6,180,881 B1 | 1/2001 | Isaak |
| 6,187,652 B1 | 2/2001 | Chou et al. |
| 6,205,654 B1 | 3/2001 | Burns |
| 6,208,521 B1 | 3/2001 | Nakatsuka |
| 6,208,546 B1 | 3/2001 | Ikeda |
| 6,214,641 B1 | 4/2001 | Akram |
| 6,215,181 B1 | 4/2001 | Akram et al. |
| 6,215,687 B1 | 4/2001 | Sugano et al. |
| 6,222,737 B1 | 4/2001 | Ross |
| 6,222,739 B1 | 4/2001 | Bhakta et al. |
| 6,225,688 B1 | 5/2001 | Kim et al. |
| 6,232,659 B1 | 5/2001 | Clayton |
| 6,233,650 B1 | 5/2001 | Johnson et al. |
| 6,234,820 B1 | 5/2001 | Perino et al. |
| 6,262,476 B1 | 7/2001 | Vidal |
| 6,262,895 B1 | 7/2001 | Forthun |
| 6,265,660 B1 | 7/2001 | Tandy |
| 6,266,252 B1 | 7/2001 | Karabatsos |
| 6,281,577 B1 | 8/2001 | Oppermann et al. |
| 6,288,907 B1 | 9/2001 | Burns |
| 6,288,924 B1 | 9/2001 | Sugano et al. |
| 6,300,679 B1 | 10/2001 | Mukerji et al. |
| 6,316,825 B1 | 11/2001 | Park et al. |
| 6,323,060 B1 | 11/2001 | Isaak |
| 6,336,262 B1 | 1/2002 | Dalal et al. |
| 6,343,020 B1 | 1/2002 | Lin et al. |
| 6,347,394 B1 | 2/2002 | Ochoa et al. |
| 6,349,050 B1 | 2/2002 | Woo et al. |
| 6,351,029 B1 | 2/2002 | Isaak |
| 6,357,023 B1 | 3/2002 | Co et al. |
| 6,358,772 B2 | 3/2002 | Miyoshi |
| 6,360,433 B1 | 3/2002 | Ross |
| 6,368,896 B2 | 4/2002 | Farnworth et al. |
| 6,370,668 B1 | 4/2002 | Garrett, Jr. et al. |
| 6,376,769 B1 | 4/2002 | Chung |
| 6,392,162 B1 | 5/2002 | Karabatsos |
| 6,404,043 B1 | 6/2002 | Isaak |
| 6,410,857 B1 | 6/2002 | Gonya |
| 6,426,240 B2 | 7/2002 | Isaak |
| 6,426,549 B1 | 7/2002 | Isaak |
| 6,426,560 B1 | 7/2002 | Kawamura et al. |
| 6,428,360 B2 | 8/2002 | Hassanzadeh et al. |
| 6,433,418 B1 | 8/2002 | Fujisawa et al. |
| 6,444,921 B1 | 9/2002 | Wang et al. |
| 6,446,158 B1 | 9/2002 | Karabatsos |
| 6,449,159 B1 * | 9/2002 | Haba .................. 361/707 |
| 6,452,826 B1 | 9/2002 | Kim et al. |
| 6,459,152 B1 | 10/2002 | Tomita et al. |
| 6,462,412 B2 | 10/2002 | Kamei et al. |
| 6,465,877 B1 | 10/2002 | Farnworth et al. |
| 6,465,893 B1 | 10/2002 | Khandros et al. |
| 6,472,735 B2 | 10/2002 | Isaak |
| 6,473,308 B2 | 10/2002 | Forthun |
| 6,486,544 B1 | 11/2002 | Hashimoto |
| 6,489,687 B1 | 12/2002 | Hashimoto |
| 6,502,161 B1 | 12/2002 | Perego et al. |
| 6,514,793 B2 | 2/2003 | Isaak |
| 6,521,984 B2 | 2/2003 | Matsuura |
| 6,528,870 B2 | 3/2003 | Fukatsu et al. |
| 6,531,772 B2 | 3/2003 | Akram et al. |
| 6,544,815 B2 | 4/2003 | Isaak |
| 6,552,910 B1 | 4/2003 | Moon et al. |
| 6,552,948 B2 | 4/2003 | Woo et al. |
| 6,560,117 B2 | 5/2003 | Moon |
| 6,566,746 B2 | 5/2003 | Isaak et al. |
| 6,572,387 B2 | 6/2003 | Burns et al. |
| 6,573,593 B1 | 6/2003 | Syri et al. |
| 6,576,992 B1 | 6/2003 | Cady et al. |
| 6,588,095 B2 | 7/2003 | Pan |
| 6,590,282 B1 | 7/2003 | Wang et al. |
| 6,600,222 B1 | 7/2003 | Levardo |
| 6,614,664 B2 | 9/2003 | Lee |
| 6,627,984 B2 | 9/2003 | Bruce et al. |
| 6,629,855 B1 | 10/2003 | North et al. |
| 6,646,936 B2 | 11/2003 | Hamamatsu et al. |
| 6,660,561 B2 | 12/2003 | Forthun |
| 6,661,092 B2 | 12/2003 | Shibata et al. |
| 6,677,670 B2 | 1/2004 | Kondo |
| 6,683,377 B1 | 1/2004 | Shim et al. |
| 6,690,584 B2 | 2/2004 | Uzuka et al. |
| 6,699,730 B2 | 3/2004 | Kim et al. |
| 6,712,226 B1 | 3/2004 | Woo et al. |
| 6,720,652 B2 | 4/2004 | Akram et al. |
| 6,721,181 B1 | 4/2004 | Pfeifer et al. |
| 6,721,185 B2 | 4/2004 | Dong et al. |
| 6,744,656 B2 | 6/2004 | Sugano et al. |
| 6,751,113 B2 | 6/2004 | Bhakta et al. |
| 6,756,661 B2 | 6/2004 | Tsuneda et al. |
| 6,760,220 B2 | 7/2004 | Canter et al. |
| 6,762,942 B1 | 7/2004 | Smith |
| 6,768,660 B2 | 7/2004 | Kong et al. |
| 6,833,981 B2 | 12/2004 | Suwabe et al. |
| 6,833,984 B1 | 12/2004 | Belgacem |
| 6,839,266 B1 | 1/2005 | Garrett, Jr. et al. |
| 6,841,868 B2 | 1/2005 | Akram et al. |
| 6,850,414 B2 | 2/2005 | Benisek et al. |
| 6,873,534 B2 | 3/2005 | Bhakta et al. |
| 6,878,571 B2 | 4/2005 | Isaak et al. |
| 6,884,653 B2 | 4/2005 | Larson |
| 6,914,324 B2 | 7/2005 | Rapport et al. |
| 6,919,626 B2 | 7/2005 | Burns |
| 6,956,284 B2 | 10/2005 | Cady et al. |
| 7,053,478 B2 | 5/2006 | Roper et al. |
| 7,094,632 B2 | 8/2006 | Cady et al. |
| 7,180,167 B2 | 2/2007 | Partridge et al. |
| 7,393,226 B2 | 7/2008 | Clayton et al. |
| 7,394,149 B2 | 7/2008 | Clayton et al. |
| 2001/0013423 A1 | 2/2001 | Dalal et al. |
| 2001/0001085 A1 | 5/2001 | Hassanzadeh et al. |
| 2001/0006252 A1 | 7/2001 | Kim et al. |
| 2001/0015487 A1 | 8/2001 | Forthun |
| 2001/0026009 A1 | 10/2001 | Tsuneda et al. |
| 2001/0028588 A1 | 10/2001 | Yamada et al. |
| 2001/0035572 A1 | 11/2001 | Isaak |
| 2001/0040793 A1 | 11/2001 | Inaba |
| 2001/0052637 A1 | 12/2001 | Akram et al. |
| 2002/0001216 A1 | 1/2002 | Sugano et al. |
| 2002/0006032 A1 | 1/2002 | Karabatsos |
| 2002/0030995 A1 | 3/2002 | Shoji |
| 2002/0076919 A1 | 6/2002 | Peters et al. |
| 2002/0094603 A1 | 7/2002 | Isaak |
| 2002/0101261 A1 | 8/2002 | Karabatsos |
| 2002/0139577 A1 | 10/2002 | Miller |
| 2002/0164838 A1 | 11/2002 | Moon et al. |
| 2002/0180022 A1 | 12/2002 | Emoto |
| 2002/0185731 A1 | 12/2002 | Akram et al. |
| 2002/0196612 A1 | 12/2002 | Gall et al. |
| 2003/0002262 A1 | 1/2003 | Benisek et al. |
| 2003/0026155 A1 | 2/2003 | Yamagata |
| 2003/0035328 A1 | 2/2003 | Hamamatsu et al. |
| 2003/0045025 A1 | 3/2003 | Coyle et al. |
| 2003/0049886 A1 | 3/2003 | Salmon |
| 2003/0064548 A1 | 4/2003 | Isaak |
| 2003/0081387 A1 | 5/2003 | Schulz |
| 2003/0081392 A1 | 5/2003 | Cady et al. |
| 2003/0089978 A1 | 5/2003 | Miyamoto et al. |

| | | | |
|---|---|---|---|
| 2003/0090879 | A1 | 5/2003 | Doblar et al. |
| 2003/0096497 | A1 | 5/2003 | Moore et al. |
| 2003/0109078 | A1 | 6/2003 | Takahashi et al. |
| 2003/0116835 | A1 | 6/2003 | Miyamoto et al. |
| 2003/0159278 | A1 | 8/2003 | Peddle |
| 2003/0168725 | A1 | 9/2003 | Warner et al. |
| 2004/0000708 | A1 | 1/2004 | Rapport et al. |
| 2004/0012991 | A1 | 1/2004 | Kozaru |
| 2004/0021211 | A1 | 2/2004 | Damberg |
| 2004/0150107 | A1 | 8/2004 | Cha et al. |
| 2004/0229402 | A1 | 11/2004 | Cady et al. |
| 2004/0236877 | A1 | 11/2004 | Burton |
| 2005/0082663 | A1 | 4/2005 | Wakiyama et al. |
| 2005/0108468 | A1 | 5/2005 | Hazelzet et al. |
| 2005/0133897 | A1 | 6/2005 | Baek et al. |
| 2005/0242423 | A1 | 11/2005 | Partridge et al. |
| 2005/0263911 | A1 | 12/2005 | Igarashi et al. |
| 2006/0020740 | A1 | 1/2006 | Bartley et al. |
| 2006/0049513 | A1* | 3/2006 | Goodwin .................. 257/712 |
| 2006/0050496 | A1 | 3/2006 | Goodwin |
| 2006/0050497 | A1 | 3/2006 | Goodwin |
| 2006/0053345 | A1 | 3/2006 | Goodwin |
| 2006/0091529 | A1 | 5/2006 | Wehrly et al. |
| 2006/0095592 | A1 | 5/2006 | Borkenhagen |
| 2006/0111866 | A1 | 5/2006 | LeClerg et al. |
| 2006/0125067 | A1 | 6/2006 | Wehrly et al. |
| 2007/0211426 | A1 | 9/2007 | Clayton et al. |
| 2007/0211711 | A1 | 9/2007 | Clayton |
| 2007/0212906 | A1 | 9/2007 | Clayton et al. |
| 2007/0212920 | A1 | 9/2007 | Clayton et al. |
| 2008/0192428 | A1 | 8/2008 | Clayton et al. |

FOREIGN PATENT DOCUMENTS

| | | |
|---|---|---|
| EP | 0 298 211 A3 | 1/1989 |
| EP | 1 119049 A2 | 7/2001 |
| GB | 2 130 025 A | 5/1984 |
| JP | 53-85159 | 7/1978 |
| JP | 58-96756 A | 6/1983 |
| JP | 3-102862 | 4/1991 |
| JP | 5-29534 A | 2/1993 |
| JP | 5-335695 A | 12/1993 |
| JP | 2821315 B2 | 11/1998 |
| JP | 2001/077294 A | 3/2001 |
| JP | 2001/085592 A | 3/2001 |
| JP | 2001/332683 A | 11/2001 |
| JP | 2002/009231 A | 1/2002 |
| JP | 2003/037246 A | 2/2003 |
| JP | 2003/086760 A | 3/2003 |
| JP | 2003/086761 A | 3/2003 |
| JP | 2003/309246 A | 10/2003 |
| JP | 2003/347503 A | 12/2003 |
| WO | WO03/037053 | 5/2003 |
| WO | WO 2004/109802 A1 | 12/2004 |

OTHER PUBLICATIONS

Complaint filed Mar. 8, 2007, in the United States District Court for the District of Massachusetts, Boston Division, Civil Action No. 07 CA 10468 DPW.

Letter dated Sep. 11, 2006, from Chris Karabatsos of Kentron Technologies to John Kelly, President of JEDEC Solid State Technology Association, concerning potential interferences involving U.S. Appl. No. 11/306,803.

PCT/US05/28547 International Search Report and Written Opinion, PCT, Aug. 18, 2006.

PCT/US05/28547 Notification Concerning Transmittal of Copy of International Preliminary Report on Patentability, Mar. 15, 2007.

GB 0516622.8 Search Report, May 25, 2006.

PCT/US06/04690 International Search Report, PCT, Feb. 16, 2007.

PCT/US06/04690 International Search Report, PCT, Jul. 20, 2007.

PCT/US06/38720 International Search Report and Written Opinion, PCT, Apr. 5, 2007.

PCT/US06/06921 International Search Report and Written Opinion, PCT, Jun. 1, 2007.

PCT/US06/007193, International Search Report and Written Opinion, PCT, Nov. 7, 2007.

Pages 19-22 of Presentation by Netlist, Aug. 2004.

Flexible Printed Circuit Technology—A Versatile Interconnection Option. (Website 2 page) Fjelstad, Joseph. Dec. 3, 2002.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002. Published on Internet.

Tessera uZ Ball Stack Package. 4 figures that purport to be directed to the uZ—Ball Stacked Memory, Published on the Internet.

Chip Scale Review Online—An Independent Journal Dedicated to the Advancement of Chip-Scale Electronics. (Webiste 9 pages) Fjelstad, Joseph, Pacific Consultants L.LC., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked-CSP Delivers Flexibility, Reliability, and Space-Saving Capabilities", vol. 3, Spring 2002. Published on the Internet.

Tessera Technologies, Inc.—Semiconductor Intellectual Property, Chip Scale Packaging—Website pp. 3, Internet.

Tessera Introduces uZ ä—Ball Stacked Memory Package for Computing and Portable Electronic Products Joyce Smaragdis, Tessera Public Relations, Sandy Skees, MCA PR (www.tessera.com/news_events/press_coverage.cfm); 2 figures that purport to be directed to the uZ ä—Ball Stacked Memory Package. Published Jul. 17, 2002 in San Jose, CA.

William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mis, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K X 16 CMOS SRAM Module.

IBM Preliminary 168 Pin SDRAM Registered DIMM Functional Description & Timing Diagrams.

3-D Interconnection for Ultra-Dense Multichip Modules, Christian VAL, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Integrated Package, Alvin Weinberg, Pacesetter, Inc. and W. Kinzy Jones, Florida International University.

* cited by examiner

SPLIT CORE CIRCUIT MODULE

RELATED APPLICATIONS

This application is a continuation-in-part of U.S. patent application Ser. No. 11/364,489, filed Feb. 27, 2006 now U.S. Pat. No. 7,289,327 and a continuation-in-part of U.S. patent application Ser. No. 11/283,355, filed Nov. 18, 2005, and a continuation-in-part of U.S. patent application Ser. No. 11/255,061, filed Oct. 19, 2005, and a continuation-in-part of U.S. patent application Ser. No. 10/934,027 filed Sep. 3, 2004. These four U.S. patent applications are hereby incorporated by reference.

TECHNICAL FIELD

The present invention relates to systems and methods for creating high density circuit modules and, in particular, to systems and methods for creating such modules that provide high capacity with thermal management features.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DIMM is typically mounted in the host computer system by inserting a contact-bearing edge of the DIMM into a card edge connector. Typically, conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DLMM. Using the DDR-200 bus protocol, approximately 144 devices may be addressed per channel. With the DDR2-400 bus protocol, only 72 devices per channel may be addressed. This constraint has led to the development of the .fully-buffered DIMM (FB-DIMM) with buffered Command Address (C/A) and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility. The FB-DIMM solution does, however, generate significant thermal energy, particularly about the AMB.

There are several known methods to improve the limited capacity of a DIMM or other circuit board. In one strategy, for example, small circuit boards (daughter cards) are connected to the DIMM to provide extra mounting space.

In another strategy, multiple die package (MDP) can also be used to increase DIMM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits. Staktek Group L.P., the assignee of the present application, has developed numerous systems for aggregating CSP (chipscale packaged) devices in space saving topologies. The increased component height of some stacking techniques may, however, alter system requirements such as, for example, required cooling airflow or the minimum spacing around a circuit board on its host system.

Typically, the known methods for improved memory module performance or enlarged capacity raise thermal management issues. For example, when a conventional packaged DRAM is mounted on a DIMM, the primary thermal path is through the balls of the package into the core of what is typically an epoxy based FR4 board that has less than desirable thermal characteristics. In particular, when an advanced memory buffer (AMB) is employed in an FM-DIMM, a significant amount of heat is generated. Consequently, the already marginal thermal shedding attributes of DIMM circuit modules is exacerbated in a typical FB-DIMM by the localized generation of heat by the AMB.

Memory DIMMs, both buffered and unbuffered, are often employed on motherboards mounted in server racks with limited space. Large capacity memory devices often have dimensions that create addition height issues (in the longitudinal direction away from the mounting socket).

What is needed, therefore, are methods and structures for providing high capacity circuit boards in thermally-efficient, reliable designs, that provide in some modes, the opportunity for concomitant reduction in module height.

SUMMARY

Flexible circuitry is populated with integrated circuitry (ICs) disposed along one or both major sides. Contacts distributed along the flexible circuitry provide connection between the module and an application environment. A rigid substrate configured with wings diverging from a central axis to create, preferably, a 'V'-shaped structure provide supportive structure for the populated flex circuitry that is wrapped about an edge of the substrate.

In some embodiments, the wings are configured to include one or more extra heat dissipating surfaces while others may include added heat dissipating structures alone one or more external sides of the module. In some embodiments, the upper surfaces of ICs populated along a surface of the flex circuitry are in thermal contact with the wings of the substrate while, if present, ICs disposed along the other side of the flex circuitry exhibit upper surfaces disposed away from the 'V'-shaped structure. Thermally conductive rigid side pieces may be attached to the rigid substrate and/or disposed in thermal contact with top surfaces of such oppositely-disposed ICs.

Some embodiments are server systems that include multiple circuit modules. Air channels may be formed between such multiple circuit modules to direct cooling air flow and such channels may be formed by single or multiple rows of modules.

DETAILED DESCRIPTION

Figure 1:
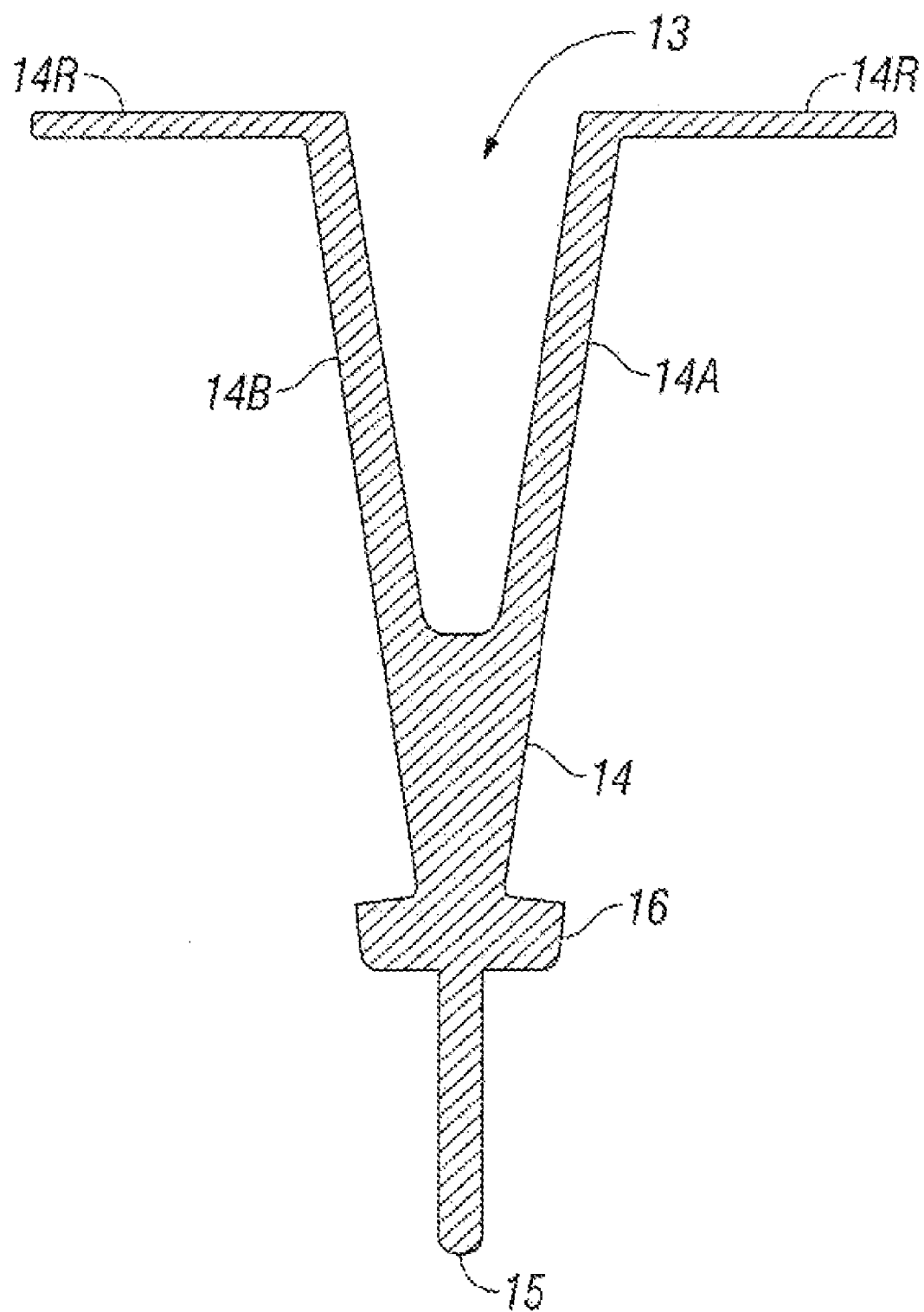
FIG. 1 depicts an exemplary substrate as may be employed in an embodiment of the present invention.

FIG. 1 depicts an exemplary substrate 14 as may be employed in some embodiments of the present invention. Depicted substrate 14 includes flex circuit strain projections 16 to accommodate flexion of flexible circuitry 12 induced when populated flex circuitry 12 is disposed about edge 15 of substrate 14 and ICs populated along flex circuitry 12 are disposed along illustrated wings 14A and 14B of substrate 14. As shown, wings 14A and 14B of substrate 14 diverge to form channel 13 between wings 14A and 14B. Those of skill will appreciate that although a "V" shape is efficient and provides advantages such as profile control and thermal improvements, wings 14A and 14B need not create a V shape and may diverge from a central portion of substrate 14 in other configurations in addition to or besides a "V". Wings 14A and 14B also include optional radiative projections 14R as shown in the depiction of this embodiment of substrate 14.

Figure 2:
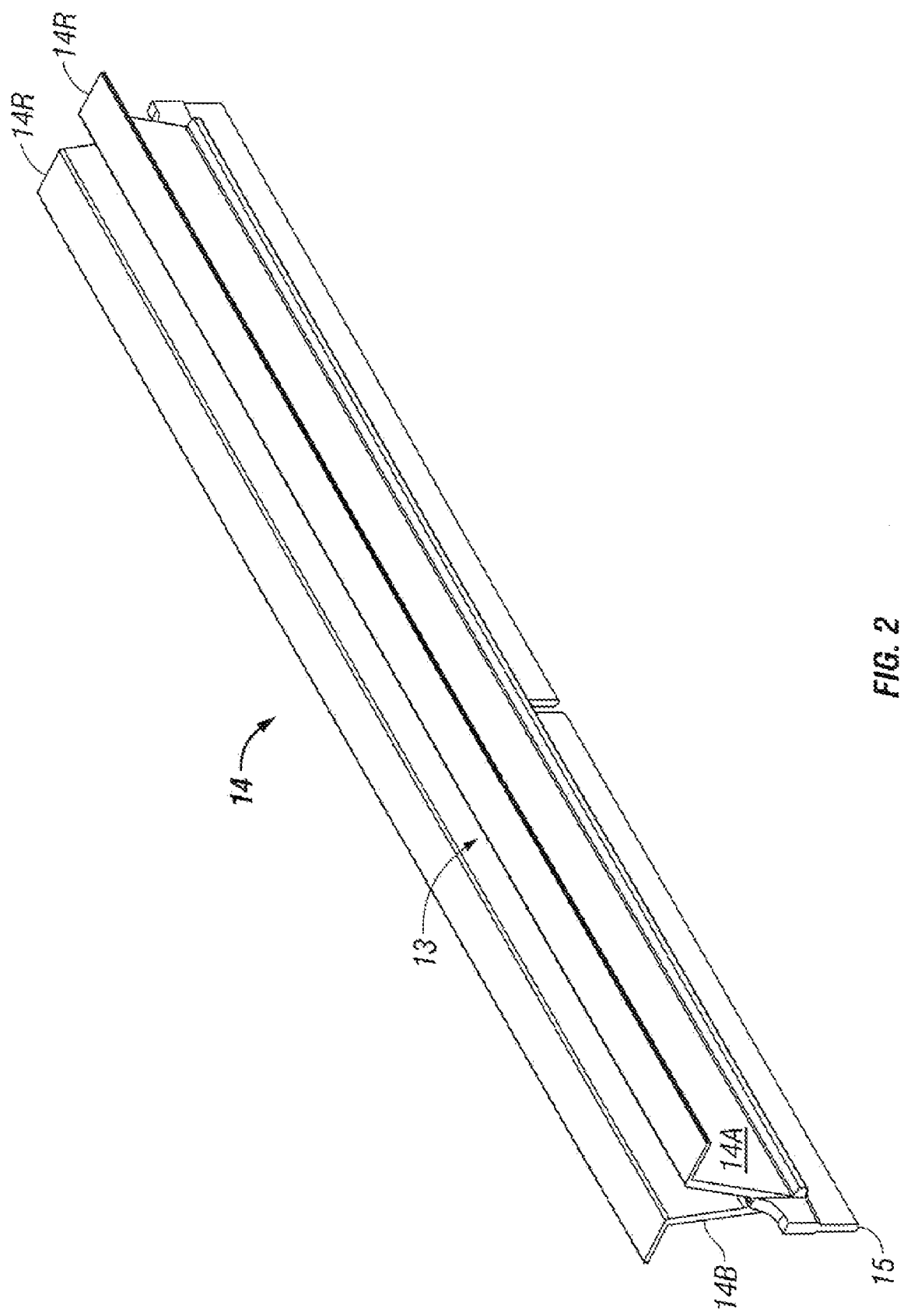
FIG. 2 is a perspective view of an exemplary substrate as may be employed in a preferred embodiment of a circuit module in accord with an embodiment.

FIG. 2 is a perspective view of a preferred substrate 14 as may be employed in a preferred embodiment of a V core circuit module.

Figure 3:
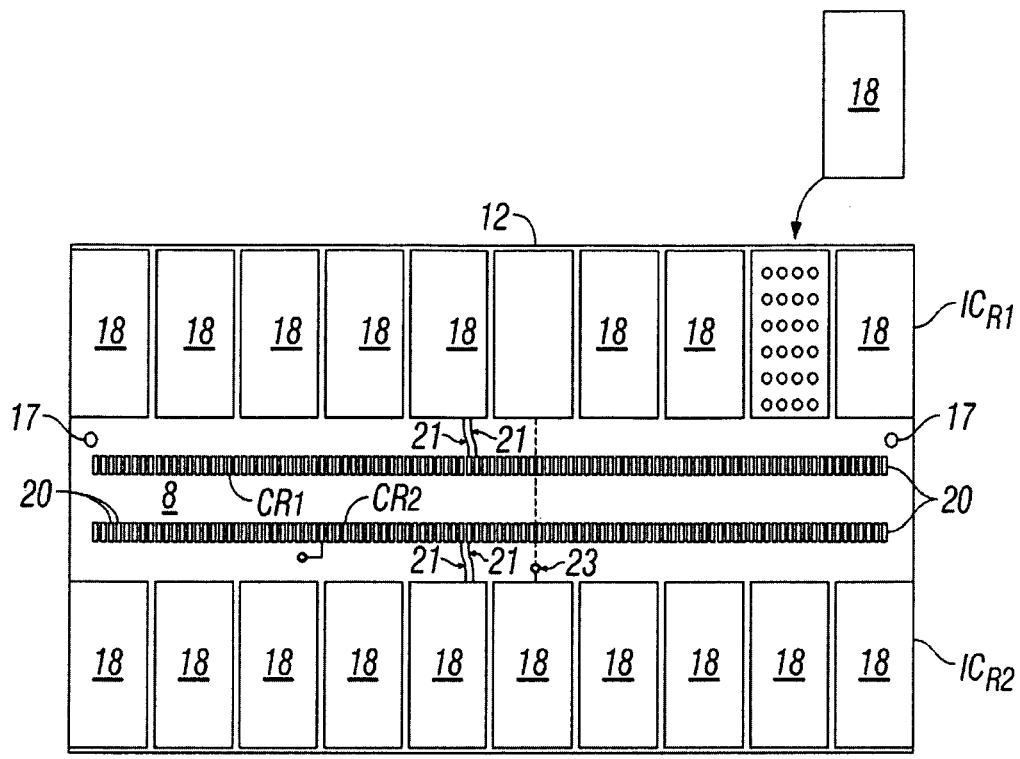
FIG. 3 depicts a layout view of a flex populated with ICs upon the depicted side according to one embodiment.

FIG. 3 depicts a layout view of a flex circuit and ICs populated upon the depicted side according to one embodiment. Depicted is an exemplar conductive trace 21 connecting rows $CR_1$, $CR_2$ of module contacts 20 to ICs 18. Those of skill will understand that there are many such traces in a typical embodiment. Traces 21 may also connect to vias that may transit to other conductive layers of flex 12 in certain embodiments having more than one conductive layer. In a preferred embodiment, vias connect ICs 18 on side 9 of flex 12 to module contacts 20. Rows of ICs $IC_{R1}$ and $IC_{R2}$ are mounted along respective IC-bearing portions of flex 12. An example via is shown as reference 23. Traces 21 may make other connections between the ICs on either side of flex 12 and may traverse the rows of module contacts 20 to interconnect ICs.

Together the various traces and vias make interconnections needed to convey data and control signals amongst the various ICs and buffer circuits. Those of skill will understand that the present invention may be implemented with only a single row of module contacts 20 and may, in other embodiments, be implemented as a module bearing ICs on only one side of flex circuit 12.

Figure 4:
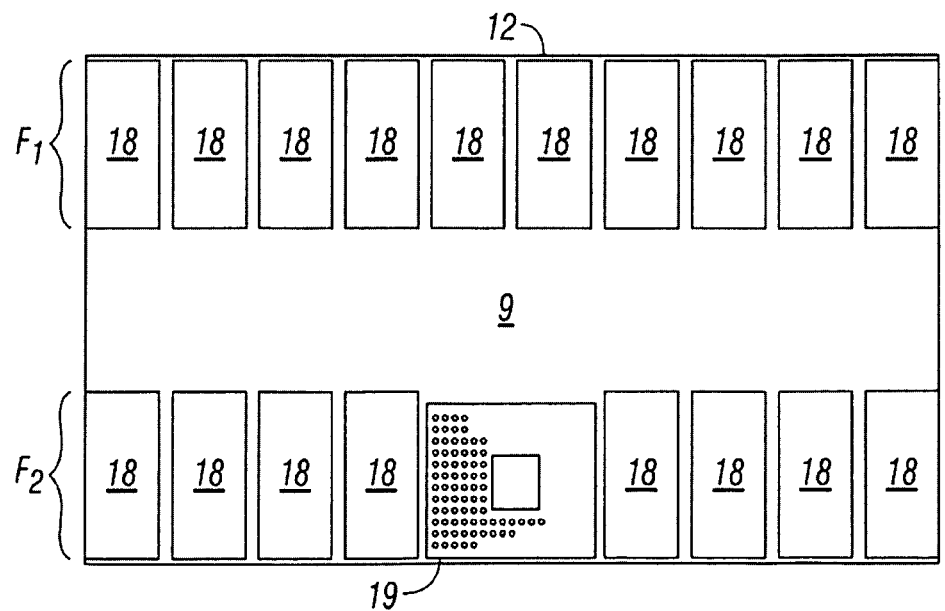
FIG. 4 depicts a layout view of a flex circuit depicting a second side of a flex circuit such as the flex circuitry shown in FIG. 3 and, in this embodiment, populated with ICs and an AMB.

FIG. 4 depicts side 9 of flex circuit 12 depicting a second side of the flex circuit shown in FIG. 3 which, in the depicted embodiment, is populated with ICs and an AMB. Those of skill will recognize that flex circuitry 12 need not be populated with an AMB and that such circuits are merely one of many optional devices that may be populated along flex circuitry 12.

Consequently, side 9 of flex circuit 12 is shown as being populated with multiple CSPs 18 and AMB circuit 19. Other embodiments may not be FB-DIMMS and may therefore have no AMB circuit 19. Side 9 includes fields F1 and F2 that each include at least one mounting contact array site for CSPs and, in the depicted case, include multiple contact arrays. Each of fields F1 and F2 include, in the depicted preferred embodiment, two pluralities of ICs similar to those identified in earlier FIG. 3 as $IC_{R1}$ and $IC_{R2}$.

Figure 5:
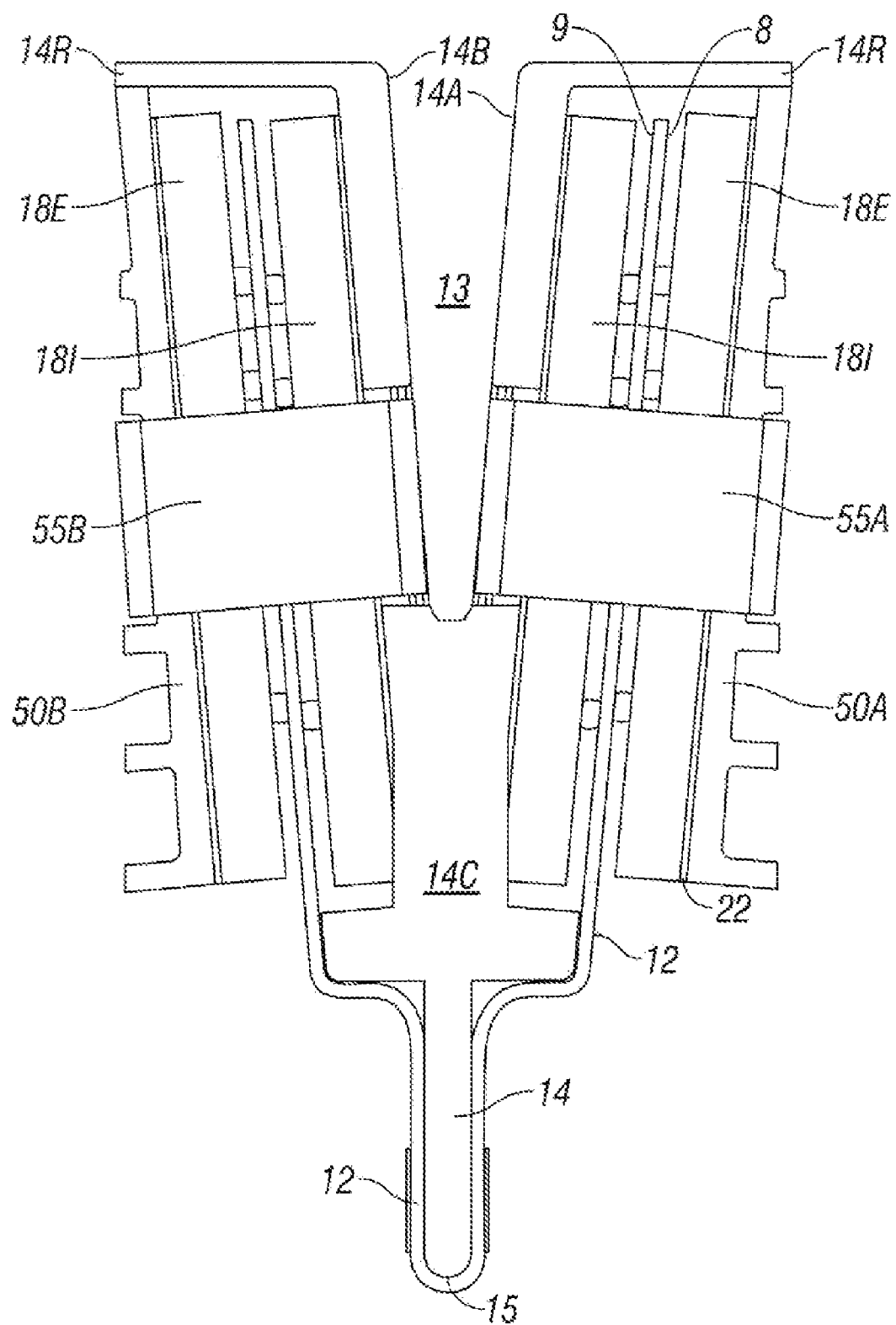
FIG. 5 depicts an exemplary circuit module in accordance with the present invention.

FIG. 5 depicts an exemplar circuit module 100 that exhibits a V core. As shown, in V core module 100, flex circuitry (flex circuit, flexible circuitry, flexible circuit) 12 is disposed about edge 15 of substrate 14. One or more integrated circuits (ICs) 18 are mounted along sides 8 and 9 of flex circuitry 12. In some embodiments, ICs 18 may be memory devices in chip scale packaging (CSP) packages. Some embodiments employ dual-die packaged ICs arranged on along increased-height wings 14A and 14B. This is advantageous because some dual packages may present one or more outer dimensions longer than typical single-die packages. The profiles shown for ICs 18 are, however, structures to indicate just some configurations of the many ICs that may be employed as ICs 18 in some embodiments. While some modules 100 may be employed as memory modules, other configurations of module 100 may have a primary function other that memory such as, for example, communications or graphics.

In general, substrate 14 is formed in the shape of a 'Y,' with a central portion 14C that branches into two wings 14A and 14B that deviate away from the centerline of portion 14C in the shape of a 'V.' Other embodiments may have wings that diverge at other angles than that depicted and, in some cases, the wings may not form a V but a "U". In some embodiments, the 'Y' shape of the substrate 14 may permit larger ICs 18 to be used while still meeting space specifications devised for traditional DIMMs. In some embodiments, substrate 14 may be made in whole or part of metal (e.g., copper, aluminum, iron, metal alloys) or other thermally conductive material, thereby conducting heat away from the ICs 18 to provide a cooling effect. Other constructions may be employed for substrate 14 such as, for example, a 'Y' outer profile and a solid or honeycombed interior, or a 'U' shaped interior channel, or rectangular channel 13.

In some embodiments, the 'Y' shape of substrate 14 may provide for comparatively greater surface area than is provided by a traditional DIMM. Preferably, convective surface area is greatly increased, on the order of 500%. Further, the depicted design provides convection cooling properties to the inner depicted sets of ICs 18 populated along inner side 9 of flex circuitry 12, by being so disposed to have an individual heat conduction path through wings 14A and 14B to the depicted 'V' channel 13 convective cooling area. The 'V' channel 13 in the depicted embodiment allows air to flow into the center of the V core module 100 to provide a temperature regulating effect.

An optional extensions 14R are shown extending from wings 14A and 14B. In some embodiments, extensions 14R may increase the surface area of the V core module 100 that may be used for temperature regulation. In some embodiments, extensions 14R may provide a surface against which an insertion force may be applied.

V core module 100 includes optional members 50A and 50B. Members 50A-50B are mounted to V core module 100 by a mount 55A and a mount 55B, which may be constructed as clips, clamps, or other joining structures. Some embodiments may not include mounts but instead employ thermally conductive adhesive, pressure sensitive adhesive (PSA), metal bonds, or other suitable attachment schemes. In some embodiments, members 50A and 50B may be made of metal or other thermally conductive material, and/or include features that may provide additional surface area for regulating the temperature of V core module 100. For example, members 50A and 50B may include fins that increase the surface area of members 50A and 50B that may be used for thermal management. Members 50A and 50B may be constructed of the same or different material from the remainder of substrate 14. They may be copper, for example, while the main body of substrate 14 may be comprised of aluminum, to name just one example. Another example could be a plastic bodied substrate 14 and a copper-based members 50A and 50B. In some embodiments, mounts 55 may be made of metal or other thermally conductive material. Preferably mount 55 may provide a path that encourages the heat energy flow between substrate 14 and sides members 50A and 50B.

Inner ICs 18I preferably have their top surfaces 22 in thermal connection to respective wings 14A and 14B of substrate 14, while the top surfaces 22 of outer (or external) ICs 18E are preferably in thermal communication with members 50A and 50B. Such thermal connection may be enhanced by thermally conductive adhesive or thermal grease, for example.

Figure 6:
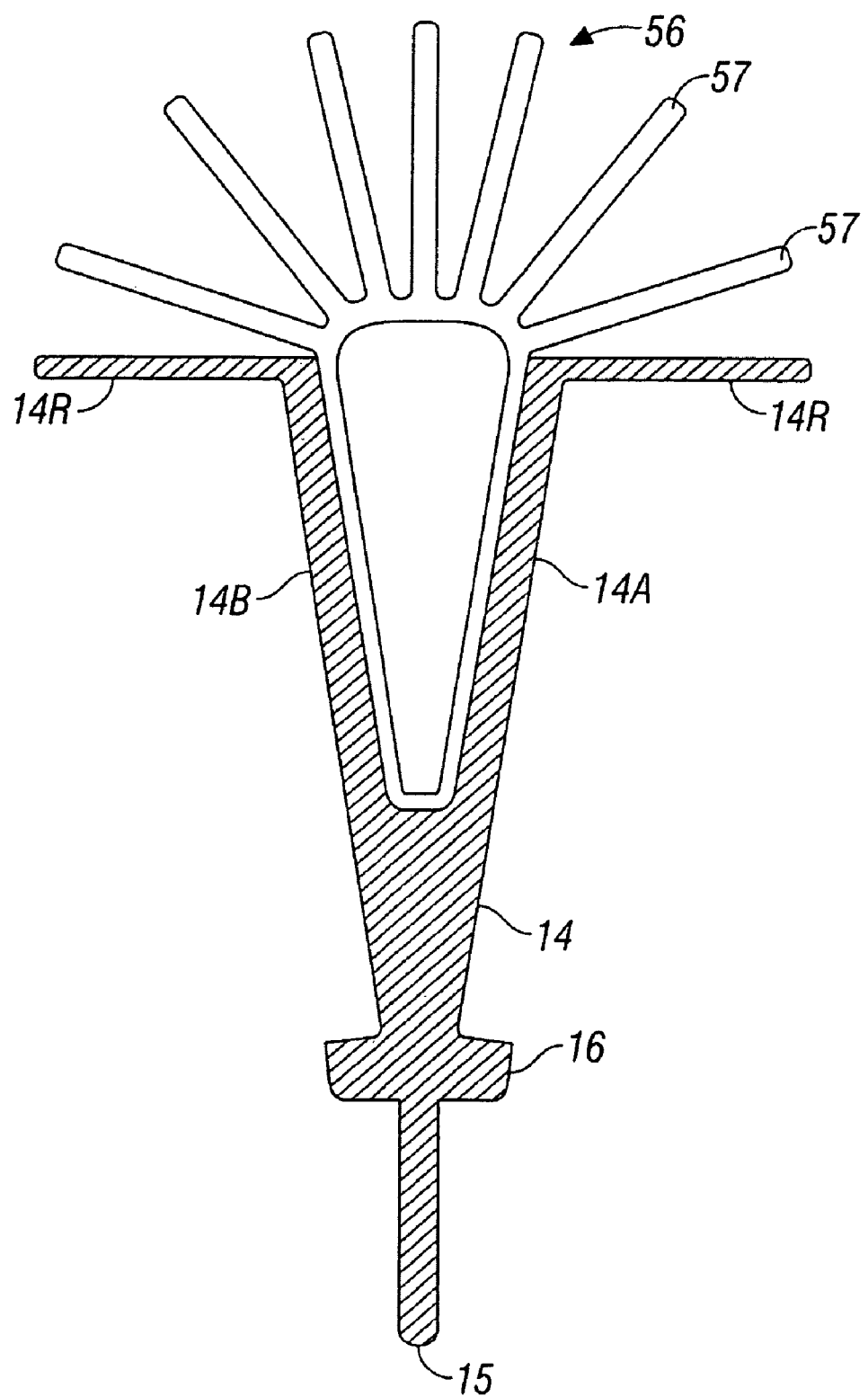
FIG. 6 depicts an exemplar substrate to which has been fitted a cooling attachment.

Those of skill in the art will recognize, after appreciating this disclosure, that substrate 14 may be comprised of more than one piece, but still exhibit the principles disclosed herein. The depicted embodiments dispose the populated area of flex circuit 12 on an outer surface of wings 14A and 14B, leaving all or a substantial area of 'V' channel 13 available for thermal management structures, such as fins or other temperature regulating features. FIG. 6 depicts an exemplar substrate 14 to which has been fitted a cooling attachment 56 having radiative fingers 57 and, as shown, cooling attachment 56 is disposed in channel 13 into which it may be clipped or set. No flex circuitry is shown in FIG. 6 to allow attention to be case unimpeded upon the substrate and cooling component 56. In some embodiments, cooling component 56 may be made of metal or other thermally conductive material. For example, cooling component 56 may be made of aluminum, and heat energy may be conduced between V core module 100 and cooling component 56 to provide thermal management for V core module 100. In some embodiments, cooling component 56 may be formed so a substantial amount of the surface of cooling component 56 may come into thermal contact with the sides of the 'V' trench. In some embodiments, cooling component 56 may include additional cooling features. For example, cooling component 56 may include fins 57 or other features that may collect or radiate thermal energy. In some embodiments, cooling component 56 may include a conduit as shown, for example, for use of fluids to enhance thermal shedding from module 100. For example, cooling component 56 may be constructed as a heat sink to provide thermal management for V core module 100. In some embodiments, cooling component 56 may include active cooling features, such as fans or thermoelectric devices (e.g., peltier junctions, p-junctions).

In some embodiments, the thin construction of flex circuit 12 may allow flex circuit 12 to conform to the shape of substrate 14. Further, thin flex circuit 12 construction provides a low flex circuit thermal impedance to allow the transfer of thermal energy through flex circuit 12. Those of skill will also recognize that a variety of construction methods may be employed to maintain mechanical integrity of module 100. Preferably, thermally conductive bonds such as metal bonding or thermally conductive epoxy secure flex circuit 12 in place.

The ICs 18 depicted along flexible circuit 12 are shown as chip-scale packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a Thin Small Outline Package (TSOP).

Various embodiments may employ leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated. Multiple integrated circuit die may be included in a package depicted as a single IC 18.

While in this embodiment, memory ICs are used to provide a memory expansion board or module, and various embodiments may include a variety of integrated circuits and other components. Such variety may include microprocessors, FPGAs, RF transceiver circuitry, digital logic, as a list of non-limiting examples, or other circuits or systems that may benefit from a high-density circuit board or module capacity. In some embodiments, V core module 100 may be a memory device, but the principles of the invention may be employed with a variety of devices such as, for example, a microprocessor or graphics processor employed in a circuit module while other embodiments will consist essentially of memory ICs only. In some embodiments, the 'V' channel 13 may provide a mounting area where additional features may be attached or inserted, examples of which being later shown here.

Figure 7:
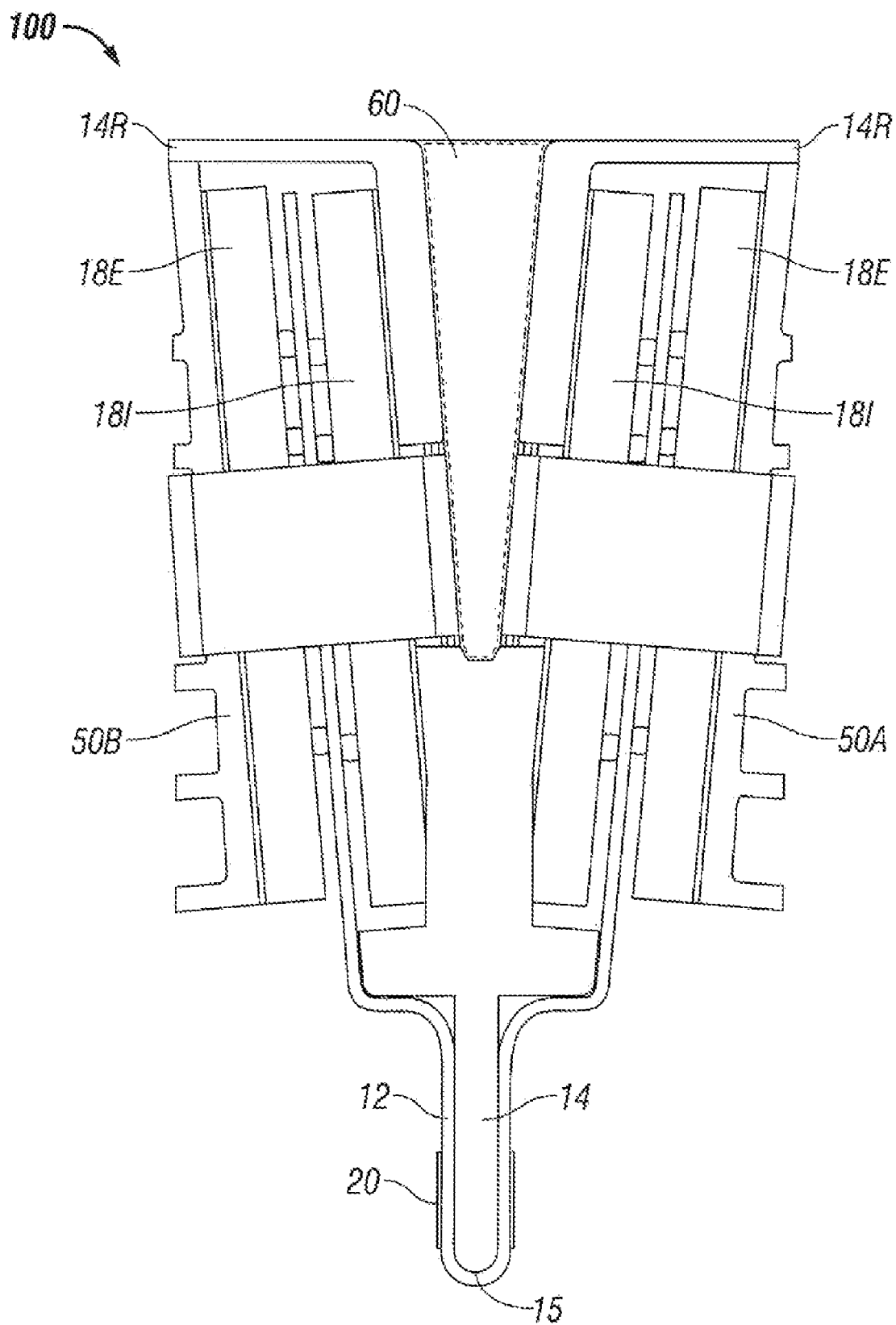
FIG. 7 depicts an exemplar module in which a cooling structure has been mounted within a 'V' channel of the exemplary circuit module.

For example, as shown in FIG. 7, a cooling conduit 60 may be mounted within the 'V' channel 13 for transporting fluids to remove heat energy from the V core module 100. Conduit 60 provides a path through which a fluid (e.g., air, water, coolant, antifreeze, oil, Freon, nitrogen, helium, ammonia) may flow to add or remove heat energy from the conduit 60, and, in turn, V core module 100. In some embodiments, conduit 60 may formed as cylindrical tube, an elliptical tube, or other shaped single passageway. For example, conduit 60 may encompass substantially the entire cross-sectional area of channel 13, thereby causing cooling component 60 to be formed as a three dimensional V-shaped member. In some embodiments, conduit 60 may be formed as a number of conduits such as, for example, two or more passageways that may allow coolant to flow through several paths within channel 13. Conduit 60 may also appear in cross section as a honeycomb of fluid passageways.

Figure 8:
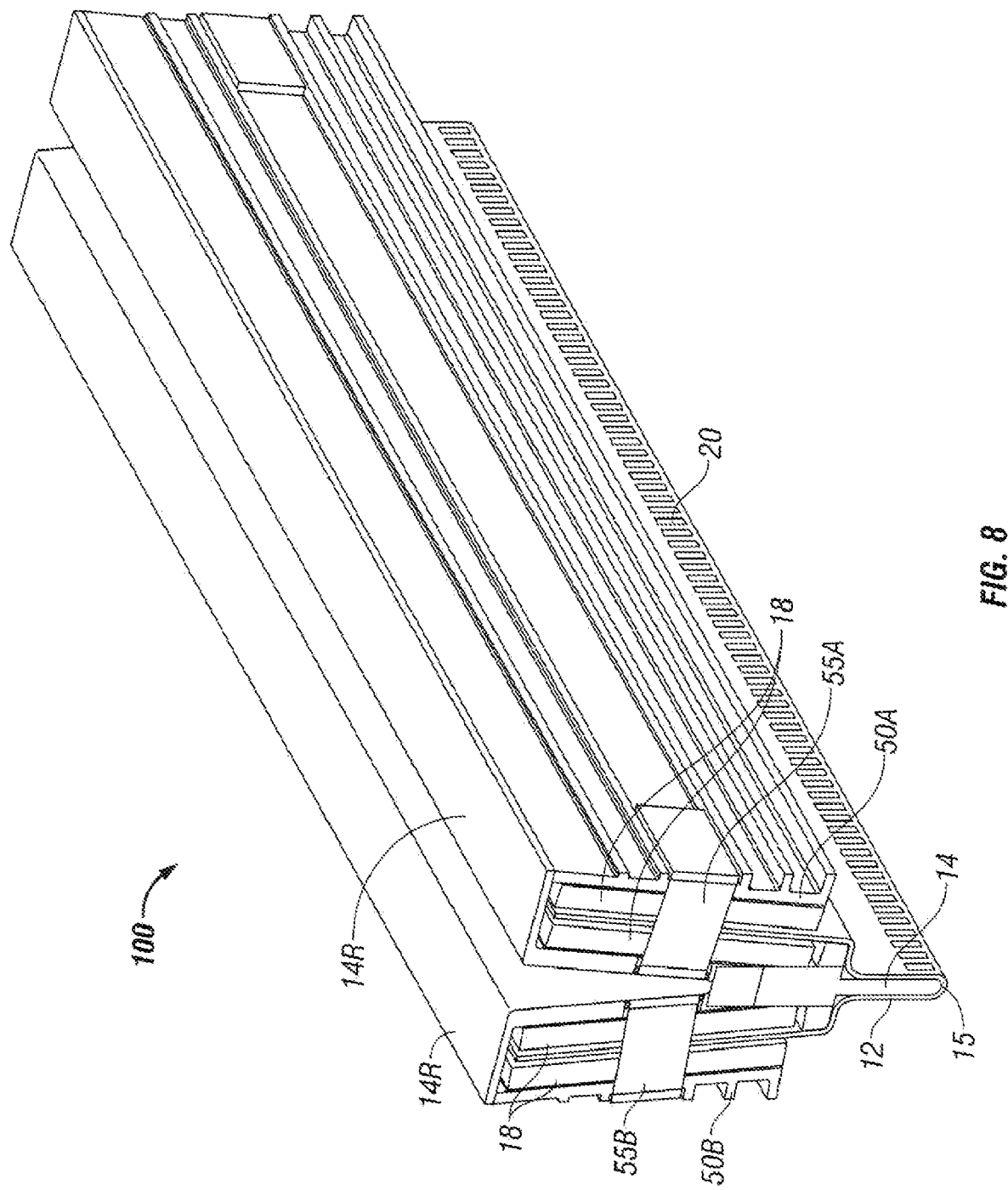
FIG. 8 depicts an exemplar circuit module in accord with an embodiment.

FIG. 8 depicts a perspective view of an exemplary V core module 100. The V core module 100 includes a number of module contacts 20 disposed along each side of the V core module 100. In some embodiments, contacts 20 need not be on both sides of the V core module 100 and may be exhibited on only one side the V core module 100.

Figure 9:
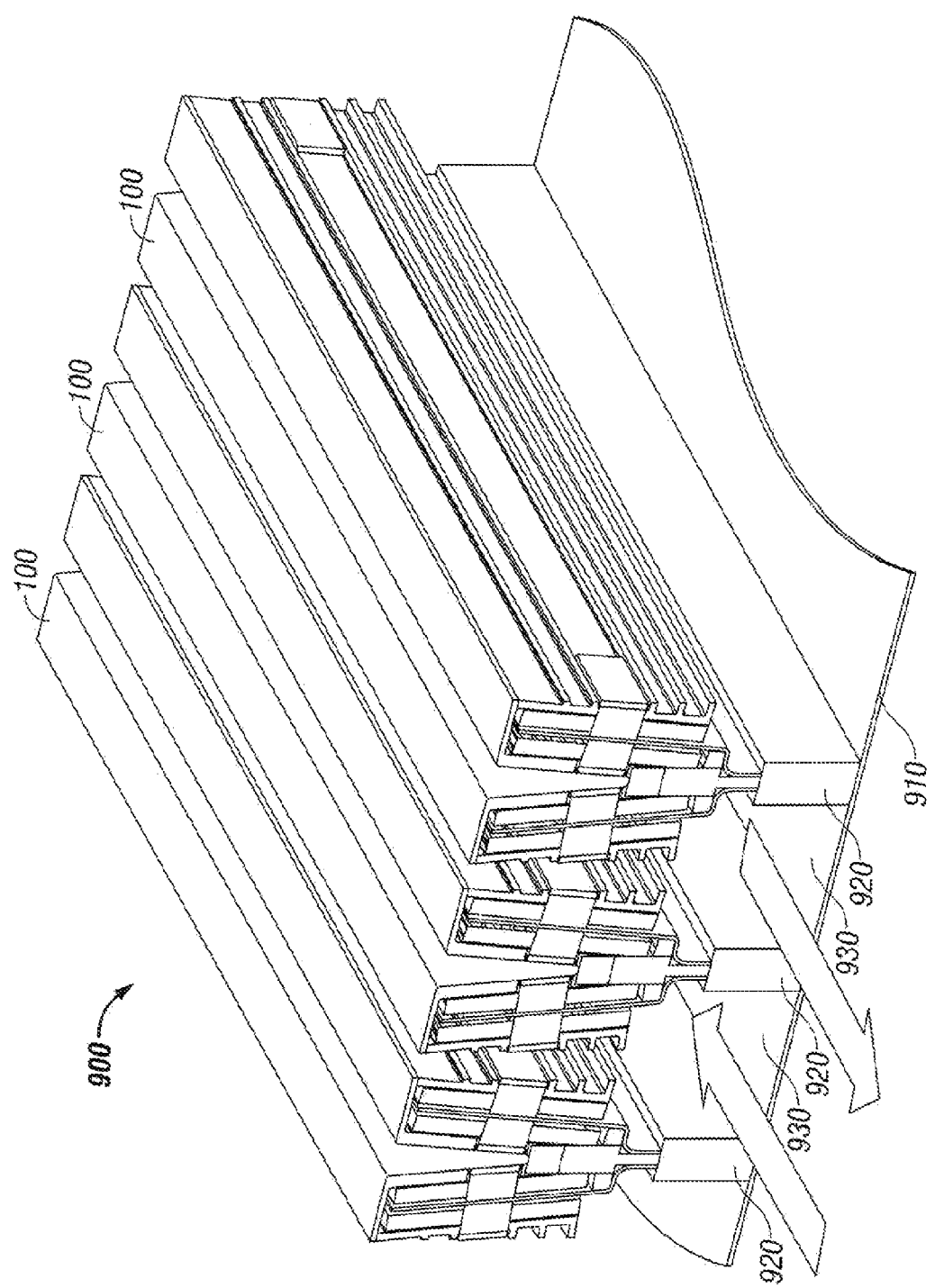
FIG. 9 depicts a perspective view of several circuit modules arranged to form cooling channels.

FIG. 9 depicts a perspective view of an arrangement 900 of several V core modules 100 arranged to form cooling channels. In general, two or more V core modules 100 may be arranged in parallel to create channels between two neighboring V core modules 100 through which a fluid, such as air, may flow to provide thermal management for V core modules 100.

Arrangement 900 includes a substrate 910. In some embodiments, substrate 910 may be a printed circuit board (e.g., a computer motherboard or other computer system, which may include a memory controller and/or microprocessor using the memory, for example, as server memory.). A number of V core modules 100 are mounted to substrate 910 by a number of mounts 920. In some embodiments, the mounts 920 may be connectors that provide support for V core modules 100 and/or provide conductive pathways between V core modules 100 and substrate 910. The mounts 920 are arranged on substrate 910 so V core modules 100 are mounted substantially parallel to each other, and spaced apart such that one, or a number of a cooling channel 930 is formed. For example, two V core modules 100 may be mounted next to each other so the upper right arm of the first V core module 100 is in close proximity to the upper left arm of the second V core module 100, and channel 930 may be formed under the adjacent arms through which air may flow. Air, or other fluid, may thereby be directed through channels 930 to provide thermal management for the V core modules 100. The arrows depicted in FIG. 9 show exemplar cooling air flow. While two-directional flow is shown in adjacent channels, one-directional flow and any combination of flow direction with redirecting air ducts may be employed to achieve thermal management air flow along similar channels in various embodiments.

Figure 10:
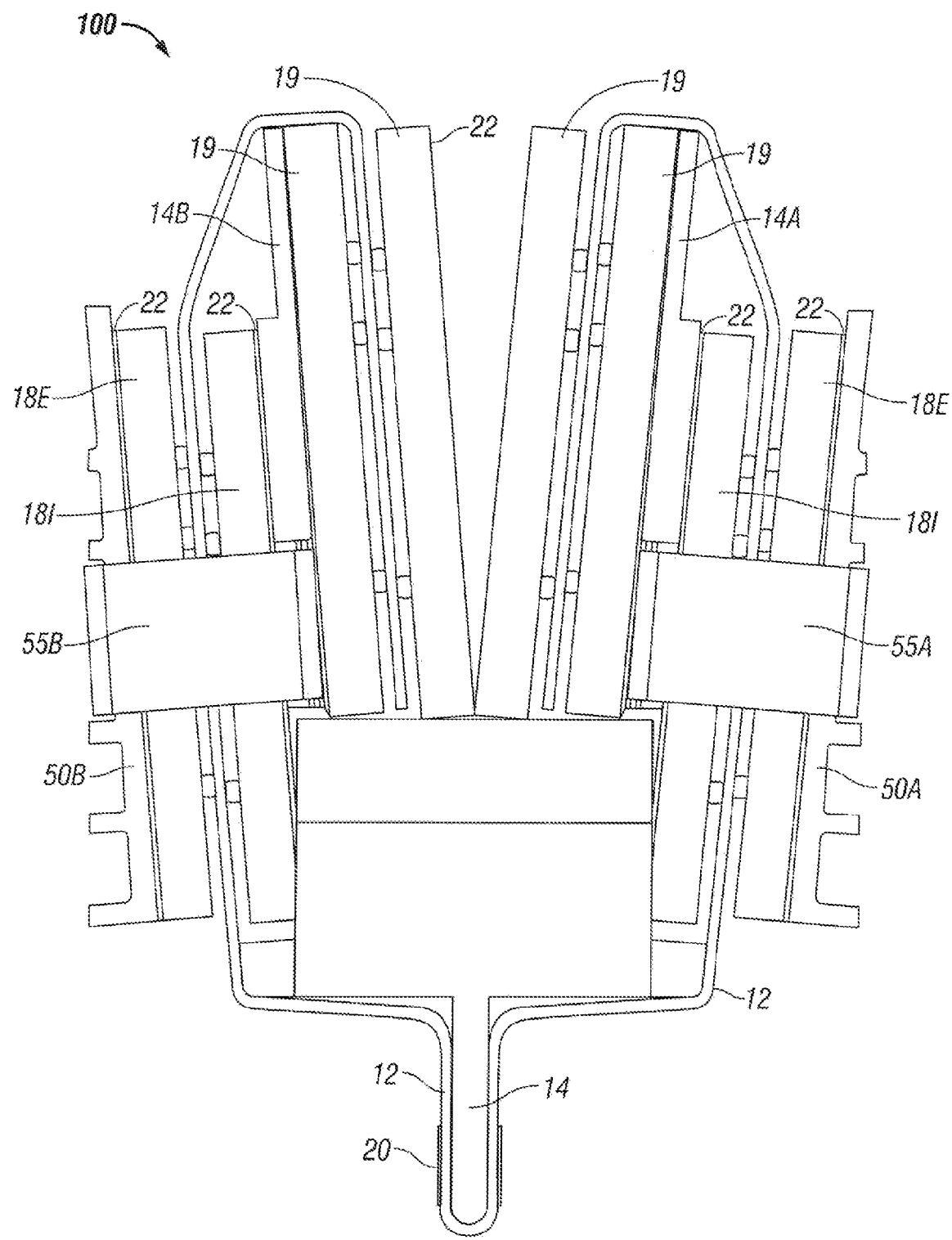
FIG. 10 depicts an exemplary circuit module with ICs mounted in a 'V' channel of the module.

FIG. 10 depicts an exemplary V core module 100 according to another embodiment having ICs mounted along the interior region of the 'V'-shaped channel 13. The V core module 100 depicted in FIG. 10, uses the space inside the 'V' channel 13 to mount additional ICs. The depicted embodiment has what are going to be identified as inner and outer ICs 19 along flex circuit 12 and which are disposed in channel 13 of substrate 14. As the depicted embodiment illustrates, ICs 18 (both 18I (inner) and 18E (outer)) are also disposed along flex circuitry 12 and ICs 18I are in thermal communication with wings 14A and 14B of substrate 14.

Flex circuitry 12 is preferably made from one or more conductive layers supported by one or more flexible substrate layers. As those of skill will recognize, flexible circuit 12 may be comprised of more than one individual flex circuit although there are substantial construction advantages to having a unitary flex circuitry along which are mounted the ICs. The construction of flex circuitry is known in the art.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

What is claimed is:

1. A circuit module comprising:
   a rigid substrate having a central leg portion with an edge and first and second wings, the wings diverging from each other and the central leg portion extending therfrom to form a 'Y'-shaped structure; and
   a flex circuit having first and second sides, the first side of the flex circuit having plural contacts adapted for connection to a circuit board socket and one of the first and second sides of the flex circuit being populated with plural memory CSPs, the flex circuit being disposed about the edge of the rigid substrate to place the first CSP-bearing portion alongside at least one of the wings of the substrate and contacts of the plural contacts being adjacent to both sides of the central leg portion of the rigid substrate.

2. The circuit module of claim 1 in which the flex circuit is populated with CSPs along its first and second sides.

3. The circuit module of claim 1 in which the rigid substrate is comprised of thermally conductive material.

4. The circuit module of claim 1 in which the rigid substrate is comprised of aluminum.

5. The circuit module of claim 1 in which the rigid substrate is comprised of copper.

6. The circuit module of claim 1 in which the rigid substrate is comprised of non-metallic material that is thermally-conductive.

7. The circuit module of claim 1 further comprising a first heat radiating portion in thermal connection with the first wing of the substrate.

8. The circuit module of claim 1 further comprising thermal members disposed along outer sides of the circuit module.

9. The circuit module of claim 1 further comprising a cooling component disposed in a channel formed by the first and second wings of the substrate.

10. The circuit module of claim 9 in which the cooling component includes at least one cooling fluid conduit.

11. A circuit module comprising:
    A rigid substrate having a central leg portion with an edge and first and second wings, the wings diverging from each other, and the central portion extends therefrom to form 'Y'-shaped structure; and
    a flex circuit having plural edge connector contacts and first and second sides populated with chip scale packaged ICs, the flex circuit being disposed about the rigid substrate to place areas of the first and second sides that bear the chip scale packaged ICs along the first and second wings of the rigid substrate.

12. The circuit module of claim 11 in which the flex circuit is populated with at least one advanced memory buffer.

13. The circuit module of claim 11 in which the rigid substrate is comprised of thermally-conductive material.

14. The circuit module of claim 11 further comprising a first heat radiating member in contact with top surfaces of at least some of the chip scale packaged ICs populating the flex circuit.

15. The circuit module of claim 14 further comprising a second heat radiating portion in contact with top surfaces of at least some others of the chip scale packaged ICs populating the flex circuit.

16. The circuit module of claim 14 further comprising a first mount piece securing the first heat radiating member in relation to the substrate.

17. The circuit module of claim 14 further comprising a cooling component mounted in a channel formed by the first and second wing portions of the substrate.

18. The circuit module of claim 14 in which the cooling component includes at least one cooling fluid conduit.

19. The circuit module of claim 14 in which the rigid substrate is comprised of metallic thermally-conductive material.

20. The circuit module of claim 14 in which the cooling component exhibits fins.

21. A circuit module comprising:
a rigid substrate having a central portion with an edge and first and second wings which diverge from each other, and the central portion extends therefrom and a flex circuit having plural edge connector contact, the flex circuit being disposed edge of the about the rigid substrate and having first and second device-bearing portions with plural memory devices mounted thereto, the first device bearing portions arranged alongside the first wing of the substrate such that the plural devices mounted thereto present top surfaces disposed away from the rigid substrate, the second device bearing portion being disposed alongside the second wing of the substrate.

22. The circuit module of claim 21 further comprising a cooling component mounted in a channel formed by the first and second wings of the substrate.

23. The circuit module of claim 22 in which the cooling component includes at least one cooling fluid conduit.

24. The circuit module of claim 22 further comprising a first heat radiating member. in contact with top surfaces of the plural memory devices.

25. The circuit module of claim 24 further comprising a first mount piece securing the first heat radiating member in relation to the substrate.

* * * * *

UNITED STATES PATENT AND TRADEMARK OFFICE
CERTIFICATE OF CORRECTION

PATENT NO. : 7,522,421 B2
APPLICATION NO. : 11/777925
DATED : April 21, 2009
INVENTOR(S) : David L. Roper It is certified that error appears in the above-identified patent and that said Letters Patent is hereby corrected as shown below:

In Claim 1, Column 8, Line 8, delete "other" and insert -- other, --, therefor.

In Claim 1, Column 8, Line 8, delete "therfrom" and insert -- therefrom --, therefor.

In Claim 11, Column 8, Line 43, before "rigid" delete "A" and insert -- a --, therefor.

In Claim 11, Column 8, Line 45, delete "central portion extends" and insert -- central leg portion extending --, therefor.

In Claim 21, Column 9, Line 14, delete "therefrom" and insert -- therefrom; --, therefor.

In Claim 21, Column 9, Line 16, delete "contact," and insert -- contacts, --, therefor.

In Claim 21, Column 9, Line 16, delete "edge" and insert -- about the edge --, therefor, In Claim 24, Column 10, Line 13, delete "member." and insert -- member --, therefor.

Signed and Sealed this

Fourteenth Day of July, 2009

JOHN DOLL
*Acting Director of the United States Patent and Trademark Office*